United States Patent
Chong et al.

(10) Patent No.: US 7,757,926 B2
(45) Date of Patent: Jul. 20, 2010

(54) TRANSDUCER ASSEMBLY FOR A BONDING APPARATUS

(75) Inventors: Chi Po Chong, Hong Kong (CN); Hing Leung Marchy Li, Singapore (SG); Wing Fai Lam, Hong Kong (CN)

(73) Assignee: ASM Assembly Automation Ltd, Hong Kong (HK)

( * ) Notice: Subject to any disclaimer, the term of this patent is extended or adjusted under 35 U.S.C. 154(b) by 432 days.

(21) Appl. No.: 11/363,763

(22) Filed: Feb. 28, 2006

(65) Prior Publication Data
US 2007/0199972 A1    Aug. 30, 2007

(51) Int. Cl.
*B23K 37/00* (2006.01)
(52) U.S. Cl. .............. 228/1.1; 228/110.1; 228/262; 156/580.1; 156/580.2
(58) Field of Classification Search .............. 228/1.1, 228/110.1, 262; 156/580.1, 580.2
See application file for complete search history.

(56) References Cited

U.S. PATENT DOCUMENTS 6,818,098 B2 *  11/2004  Sato et al. ............... 156/580.2

2003/0168938 A1 *  9/2003  Wallaschek et al. ......... 310/328

OTHER PUBLICATIONS

Ultrasonic transducers Overview for Applying Ultrasonic Technology, www.airmar.com, Feb. 11, 2006.*

* cited by examiner

*Primary Examiner*—Jessica L Ward
*Assistant Examiner*—Erin B Saad
(74) *Attorney, Agent, or Firm*—Ostrolenk Faber LLP (57) ABSTRACT

A transducer assembly for a bonding apparatus is provided that comprises a horn having first and second base ends and a bonding tool attached to the horn between the first and second base ends. First and second ultrasonic generators are secured to the first and second base ends respectively. A first fastening mechanism is located on the horn between the bonding tool and the first ultrasonic generator and a second fastening mechanism is located on the horn between the bonding tool and the second ultrasonic generator such that the horn is releasably attachable to a mounting interface using the first and second fastening mechanisms. There are also transducer mounting positions disposed on the mounting interface for mounting the mounting interface to a bond head.

14 Claims, 5 Drawing Sheets

TRANSDUCER ASSEMBLY FOR A BONDING APPARATUS

FIELD OF THE INVENTION

The invention relates to a transducer assembly, and in particular to a transducer assembly that is mountable to a semiconductor processing machine, such as a bonding machine.

BACKGROUND AND PRIOR ART

Thermosonic flip chip bonding is a key manufacturing process in electronic packaging in which a semiconductor chip is electrically connected to a substrate or to another chip directly with conductive bumps instead of using interconnections such as bonding wires in wire bonding, or tapes in tape automated bonding ("TAB"). A flip chip device is manufactured by first forming electrically conductive bumps onto a semiconductor chip, and thereafter flipping the chip that is formed with the conductive bumps for directly bonding the bumps onto equivalently placed bond pads on a substrate or on another chip. The electrically conductive bumps may comprise gold or solder.

The process in which the conductive bumps are attached to the bond pads utilizes an ultrasonic transducer for providing ultrasonic vibrational energy to the conductive bumps, thereby bonding the conductive bumps onto the bond pads by mutual friction between the surfaces.

Figures 1A, 1B:
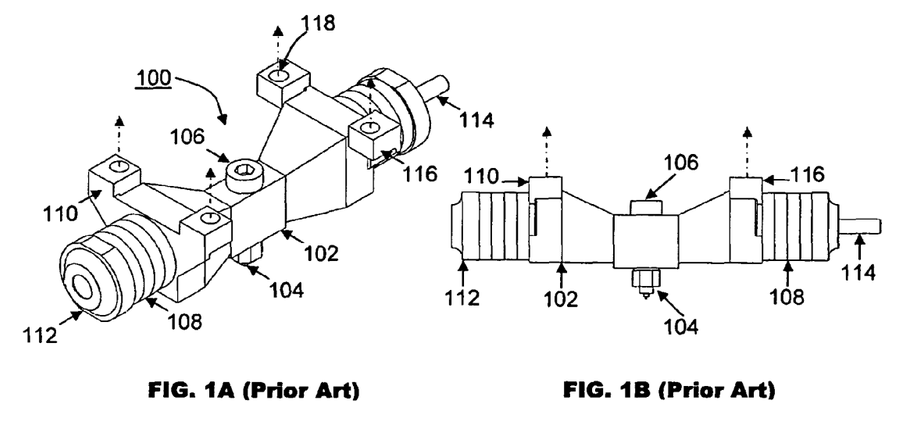
FIGS. 1A and 1B are an isometric view and a front view respectively of a transducer of the prior art.

FIGS. 1A and 1B are an isometric view and a front view respectively of a transducer 100 of the prior art. The transducer 100 comprises a substantially symmetrical polyhedral main body, such as a horn 102. The horn 102 includes two base ends 110, with one base end 110 at each side of the horn 102. The base ends 110 converge towards a narrower section in the middle of the horn 102 for mounting a bonding tool.

The middle section of the horn 102 further comprises a tapered hole for inserting a bonding tool to hold a chip to perform bonding. The bonding tool may be in the form of a cylindrical collet 104. The collet 104 is locked into position by a collet screw 106.

The collet 104 comprises a vacuum hole disposed along its longitudinal axis. The vacuum hole of the collet 104 is connected to an air passage and a vacuum tube 114 extending from one of the base ends 110 of the horn 102. Hence, when vacuum suction is applied through the vacuum tube 114 during the bonding process, the collet 104 will be able to hold a chip at the tip of the collet 104 using vacuum suction.

The transducer 100 further comprises ultrasonic generators 108 mounted at the base ends 110 of the horn 102. Each ultrasonic generator 108 includes a stack of piezoelectric elements axially connected and pre-loaded by a back plate 112 screwed into the horn 102 to secure the piezoelectric elements.

When the ultrasonic generators 108 are activated, they will generate ultrasonic vibrational energy that is transmitted from the generators 108 to the base ends 110 of the horn 102, through to the collet 104, and eventually to the tip of the collet 104. As such, the tip of the collet 104 will vibrate in accordance with a characteristic driving frequency and a corresponding amplitude of vibration.

Figure 2:
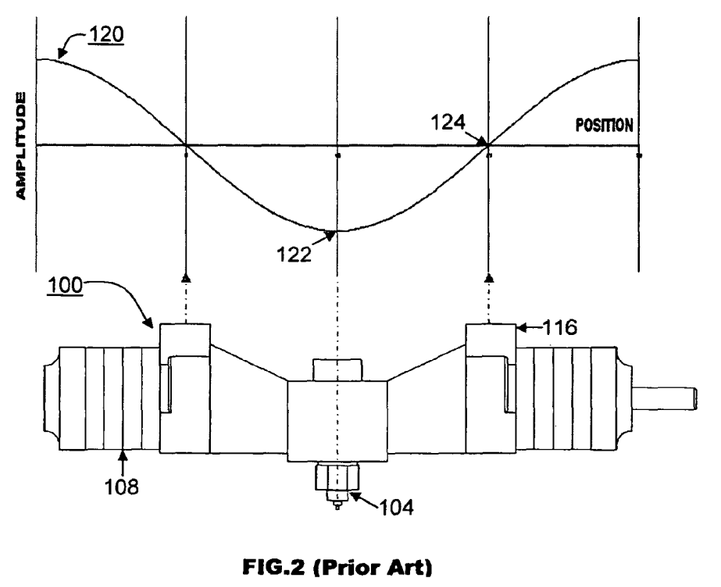
FIG. 2 is a graph showing the varying amplitudes of vibration along the transducer of the prior art when ultrasonic vibrational energy is generated.

The ultrasonic vibrational energy generated by the ultrasonic generators 108 will excite the transducer 100 such that the amplitude of vibration along the longitudinal axis of the transducer 100 exhibits characteristics of a standing waveform. FIG. 2 is a graph showing the varying amplitudes of vibration 120 along the transducer 100 of the prior art when ultrasonic vibrational energy is generated. In order to deliver a maximum amplitude of vibration for the bonding process, the tip of the collet 104 is preferably disposed at an anti-nodal position 122 of the standing waveform. This is at the middle of the horn 102 where the amplitude of vibration is at its maximum.

The horn 102 of the transducer 100 further comprises four L-shaped flange mounts 116, each disposed respectively at the four corners of the horn 102 for attaching the transducer 100 to a bonding apparatus (not shown) through the use of mounting holes 118 in the flange mounts 116. The flange mounts 116 are integrally connected to the horn 102 through thin flanges such that they project from the front and back of the horn 102, and so that a contact area between the flange mounts 116 and the main body of the horn 102 is minimal.

As shown in FIG. 2, the mounting holes 118 of the flange mounts 116 are located at nodal points on the transducer 100 where there is a minimum amplitude of vibration. This is to prevent the loss of ultrasonic vibrational energy through transmission of the same via the mounting interface to the bonding apparatus. The vibrational energy lost through the flange mounts 116 is therefore minimized and the ultrasonic vibrational energy may be effectively transmitted from the horn 102 to the collet 104. It would be appreciated that reduced vibrational energy at the tip of the collet 104 will affect the bonding between the conductive bumps and the bond pads, and hence affect the strength of the interconnections between the semiconductor components.

Figure 3:
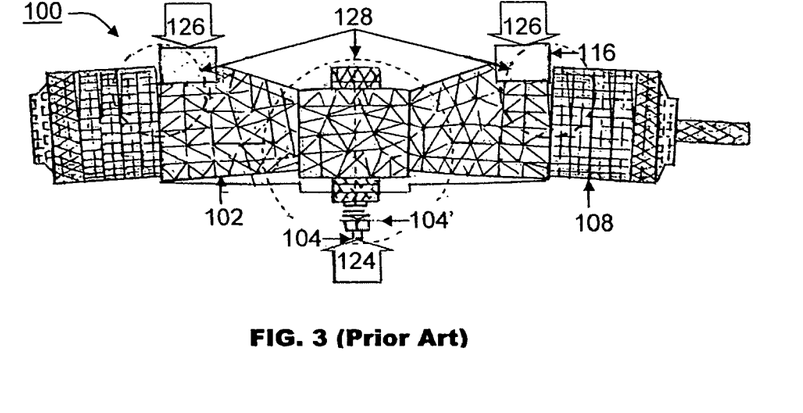
FIG. 3 is a Finite Element Analysis (FEA) mesh diagram showing the effect of an upward reaction force exerted on the collet of the transducer of the prior art.

During the bonding process, high pressure and power are required to drive the transducer 100 for simultaneously bonding a number of conductive bumps onto the bond pads. The collet 104 of the transducer 100 therefore will experience an upward reaction force when pushing down onto a chip. FIG. 3 is a Finite Element Analysis (FEA) mesh diagram showing the effect of an upward reaction force 124 exerted on the collet 104 of the transducer 100 of the prior art. When the upward reaction force 124 is exerted on the tip of the collet 104, the tip will retract and be shifted to a new position at 104'.

The upward force 124 exerted on the collet 104 introduces further reaction forces 126 experienced at the flange mounts 116, and hence bending moments are induced on the horn 102. Since the L-shaped flange mounts 116 are rigidly connected to the body of the horn 102 by relatively thin flanges, the areas of the flange mounts 116 are bent significantly by the reaction forces 126. These deformation regions 128 are circled in FIG. 3, and they cause internal stresses within the lattice structure of the horn 102. In turn, this leads to reduced structural rigidity of the transducer 100 as a whole and higher compressive extension. Consequently, the risk of permanent deformation is high. This is likely to cause misalignment of the chip with respect to the bonding surface during the placement of a chip onto the corresponding bond pads, and thus affecting the ability to properly bond the conductive bumps to the bond pads.

Moreover, if the flange mounts 116 are deformed and are offset from the nodal positions 124 of the standing waveform, the transducer 100 can also be easily excited by undesirable resonance frequencies transmitted through the bonding apparatus 118. This is of major concern if the undesirable resonance frequencies are close to the operating resonance frequency of the transducer 100. When this occurs, these acoustic interference frequencies will introduce disturbances, such as noise, to the ultrasonic bonding operation, and thus affect the bonding quality.

Another disadvantage of the deformation of the flange mounts 116 is that some ultrasonic energy will be lost through the flange mounts 116, resulting in lesser vibrational energy transmitted to the collet 104, and a reduced amplitude of vibration at the tip of the collet 104. This affects the bonding strength between the conductive bumps and the bond pads. This problem is especially apparent in the reduction of the shear strength of a bonded chip, resulting in the chip shearing off from the bonding surface more easily.

Figure 4:
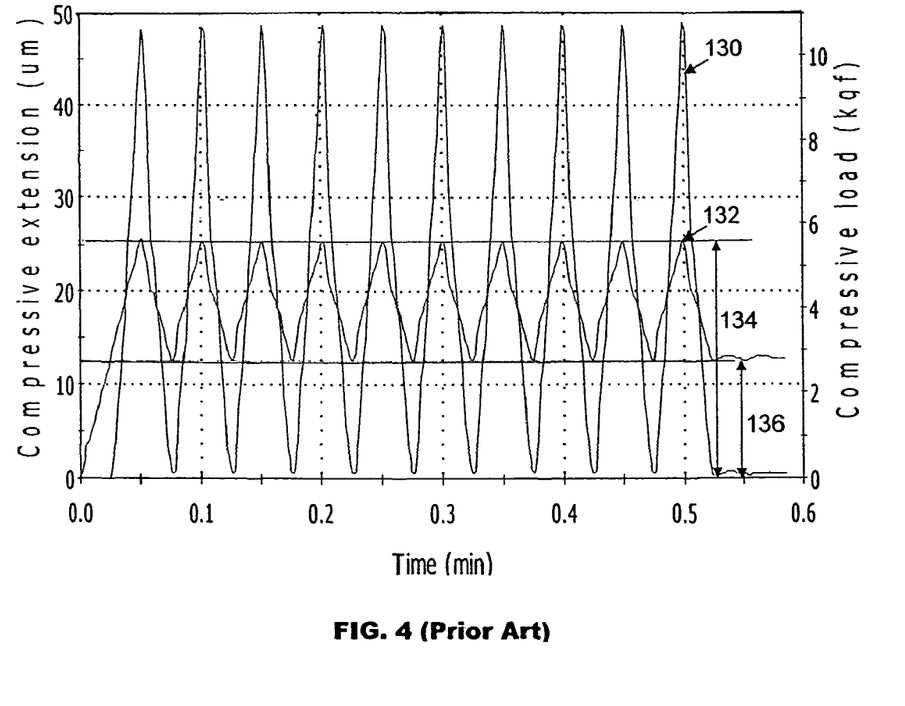
FIG. 4 is a graph showing compressive extension occurring at the tip of the collet when the transducer of the prior art is applied with compressive forces.

FIG. 4 is a graph showing compressive extension 132 occurring at the tip of the collet 104 when the transducer 100 of the prior art is applied with a compressive forces 130. During the bonding operation cycle, high pressure and power are repeatedly applied on the transducer 100. Thus, the transducer 100 will experience compressive forces on the tip of the collet 104. As such, the tip of the collet 104 will retract in accordance with the compressive forces when the horn body is bent and deformed. The deformation of the horn body 102 may be measured by compressive extension at the tip of the collet 104. If the compressive extension of the collet 104 is within a range such that the internal stress in the horn 102 has not exceeded the elastic limit of the strength of the material, no permanent or plastic deformation will be observable in the horn 102 when the compressive forces are removed.

The data recorded shows that when a compressive force 130 of 10 kgf is applied to the collet 104 at 0.05 minutes (3 seconds) per cycle, the collet 104 retracts to a maximum compressive extension 134 of approximately 26 μm and oscillates with an amplitude of 13 μm. When the compressive forces 130 were removed at the end of the bonding process, a permanent deformation 136 of approximately 13 μm was observed to have set in at the tip of the collet 104. This irreversible plastic deformation in the horn 102 will degrade the performance of the transducer 100.

An alternative approach which may alleviate some of the aforesaid problems of the prior art is illustrated in U.S. Pat. No. 6,758,383 entitled "Transducer for a Bonding Apparatus". This approach provides a transducer which includes a pair of connecting portions symmetrically located on opposite sides of a horn parallel to the longitudinal axial centre of a horn main body. The connecting portions have four symmetrically located mounting screw holes for attaching the transducer to a bonding apparatus. The connecting portions help to protect the structural rigidity of the transducer.

However, the problem with such a transducer design is that the mounting screw holes are formed on the connecting portions, and the connecting portions are rigidly mounted to the horn body such that the connecting portions are subject to deformation forces together with the horn body during bonding. As a result, the connecting portions are similarly bent together with the horn as in the prior art described previously when reaction forces act on the collet. Consequently, permanent plastic deformation could still occur due to pronounced bending of the connecting portions and the horn main body after the bonding process.

It would be advantageous to avoid some of the aforesaid disadvantages of the prior art by separating the mounting portion of a transducer assembly from rigid connection to the horn body so as to reduce the bending of the mounting portion together with the bending of the horn, which would in turn reduce interference with vibration of the horn as well as the risk of permanent deformation of the transducer.

SUMMARY OF THE INVENTION

It is thus an object of the invention to seek to provide a strengthened supporting member for the transducer that improves structural integrity and that is also configured to minimize the disturbance of ultrasonic generation to a chip being bonded.

Accordingly, the invention provides a transducer assembly for a bonding apparatus, comprising: a horn having first and second base ends; a bonding tool attached to the horn between the first and second base ends; a first ultrasonic generator secured to the first base end and a second ultrasonic generator secured to the second base end; a first fastening mechanism located on the horn between the bonding tool and the first ultrasonic generator and a second fastening mechanism located on the horn between the bonding tool and the second ultrasonic generator; a mounting interface to which the horn is releasably attachable using the first and second fastening mechanisms; and transducer mounting positions disposed on the mounting interface for mounting the mounting interface to a bond head.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

Examples of apparatus and methods for mounting a transducer in accordance with the invention will now be described with reference to the accompanying drawings, in which.

DETAILED DESCRIPTION OF THE PREFERRED EMBODIMENT

Figure 5:
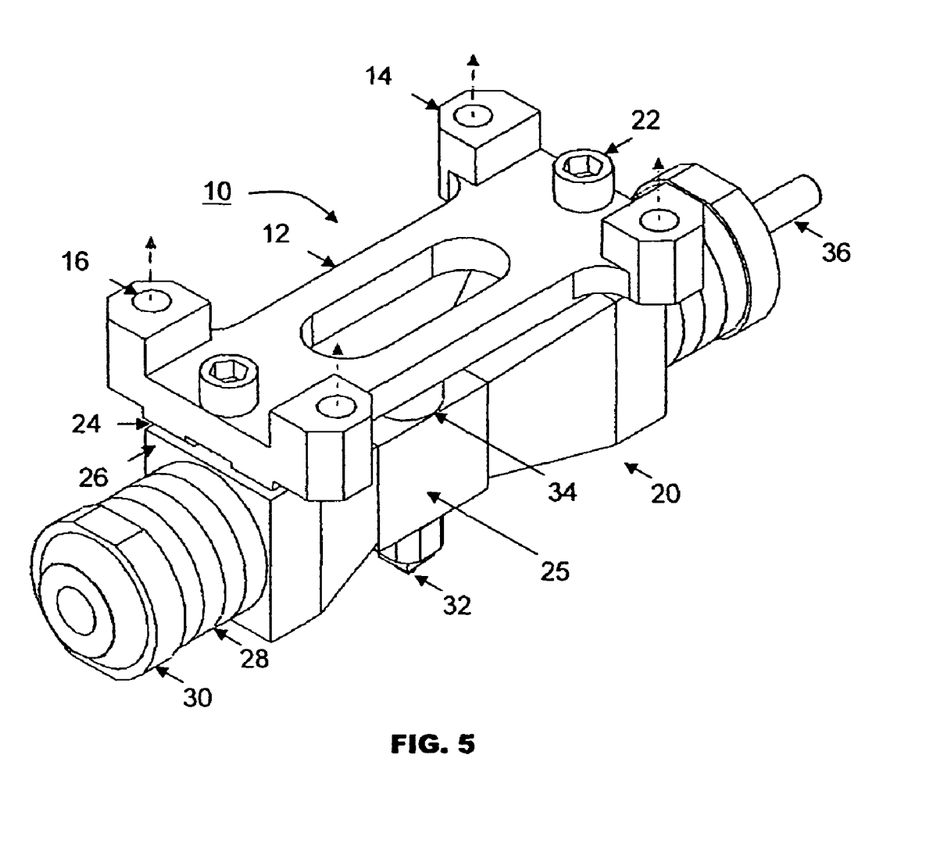
FIG. 5 is an isometric view of a transducer assembly according to the preferred embodiment of the invention.
Figure 6:
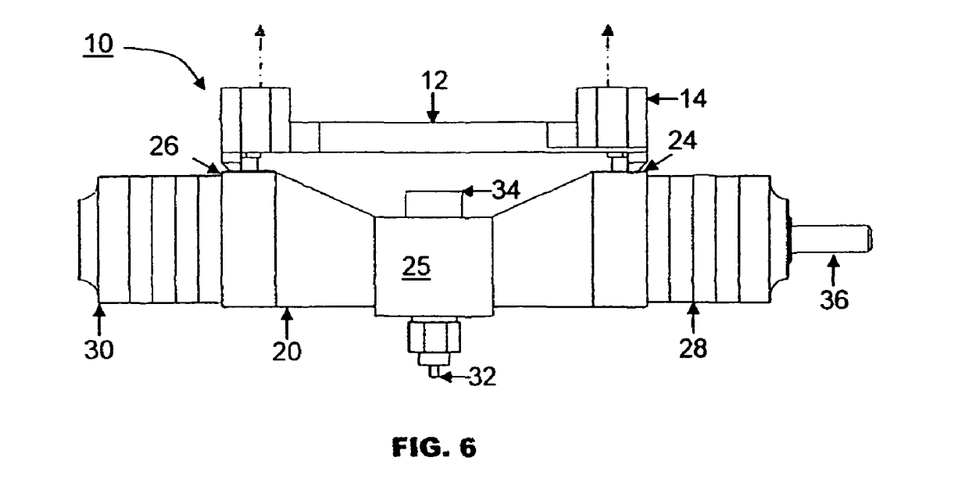
FIG. 6 is a front view of the transducer assembly shown in FIG. 5.

Referring to the drawings in which like parts are referred to by like numerals, FIG. 5 is an isometric view of a transducer assembly 10 according to the preferred embodiment of the invention. FIG. 6 is a front view of the transducer assembly 10 shown in FIG. 5. The transducer 10 comprises a substantially symmetrical polyhedral main body that forms a horn 20. The horn 20 includes first and second base ends 26 on its opposite sides. The base ends 26 converge towards a narrower midsection 25 at the middle of the horn 20. By controlling the convergence ratio between the base ends 26 and the midsection 25, ultrasonic vibration energy is configurable to obtain a desired amplitude of vibration at the middle of the horn 20.

The horn 20 further comprises a tapered hole at the midsection 25 for inserting a bonding tool between the base ends 26 to hold a chip during bonding. The bonding tool may be in the form of a cylindrical collet 32. The collet 32 is locked into position by a collet screw 34.

The collet 32 comprises a vacuum hole disposed along its longitudinal axis. The vacuum hole of the collet 32 is connected to an air passage and a vacuum tube 36 extending from one of the base ends 26 of the horn 20. Hence, when vacuum suction is applied through the vacuum tube 36 during the bonding process, the collet 32 will hold a chip at the tip of the collet 32 by vacuum suction.

The transducer 10 further comprises first and second ultrasonic generators 28 secured to the first and second base ends 26 of the horn 20 respectively. Each ultrasonic generator 28 includes a stack of piezoelectric elements that are axially connected and pre-loaded by a back plate 30 screwed onto the stack.

When the ultrasonic generators 28 are activated, they will generate ultrasonic vibrational energy that is transmitted from the ultrasonic generators 28 to the base ends 26, through the horn 20 to the midsection 25, and eventually through the collet 32 to the tip of the collet 32. As such, the tip of the collet 32 will vibrate in accordance with a characteristic driving frequency and a corresponding amplitude of vibration generated by the ultrasonic generators 28.

The horn 20 of the transducer 10 further comprises first and second fastening mechanisms located on the horn 20 between the bonding tool and the first and second ultrasonic generators 28 respectively. Each fastening mechanism includes a threaded mounting hole 24 disposed on a surface of the horn for receiving a screw in order to attach a mounting interface to the horn 20. The mounting holes 24 are preferably located at the nodal positions of ultrasonic vibration where the amplitudes of vibration generated by the ultrasonic generators 28 are minimal. Therefore, the loss of ultrasonic vibrational energy via transmission through the mounting portions of the horn 20 can be minimized.

The fastening mechanisms allow the horn 20 to be releasably attachable to the mounting interface, which may comprise a holder 12. The holder 12 is preferably in the form of a substantially flat plate and is disposed between the horn 20 and the bonding apparatus for mounting the transducer assembly 10 to a bond head (not shown) of the bonding apparatus. It is further preferred that the holder 12 is made of material having a higher rigidity than the horn 20. The holder 12 has through-holes that are located such that they correspond to the threaded mounting holes 24 of the horn 20. Thus, the holder 12 may be attached to the horn 20 using the fastening mechanism by fastening mounting screws 22 through the through-holes of the holder 12 into the threaded mounting holes of the horn 20.

The holder 12 also has transducer mounting positions, which may comprise flange mounts 14 disposed substantially at the periphery of the plate, such as at the corners thereof, for mounting the holder 12 to a bond head of the bonding apparatus. Where screws are used, mounting holes 16 are formed on the flange mounts 14 for said mounting.

In order to reduce a contact surface area at the mounting interface between the horn 20 and the holder 12, the holder 12 may include a plurality of point contact surfaces that are disposed parallel to the mounting interface between the holder 12 and the horn 20, and along the nodal positions of the horn 20, where the amplitudes of vibration are minimal. Thus, the reduced contact surfaces effectively reduce the loss of ultrasonic vibrational energy through the mounting interface between the holder 12 and the horn 20.

As ultrasonic energy may be more easily transmitted across materials with similar acoustic impedance, it is preferable that the holder 12 and the horn 20 be made of acoustically dissimilar material, such as a wear resistant and hardened stainless steel (eg. SUS420) for the holder 12 and an austenitic stainless steel (eg. SUS 304) for the horn 20. As such, the material differences between the holder 12 and the horn 20 will impede the transmission of ultrasonic vibrational energy across the material interface.

Figure 7:
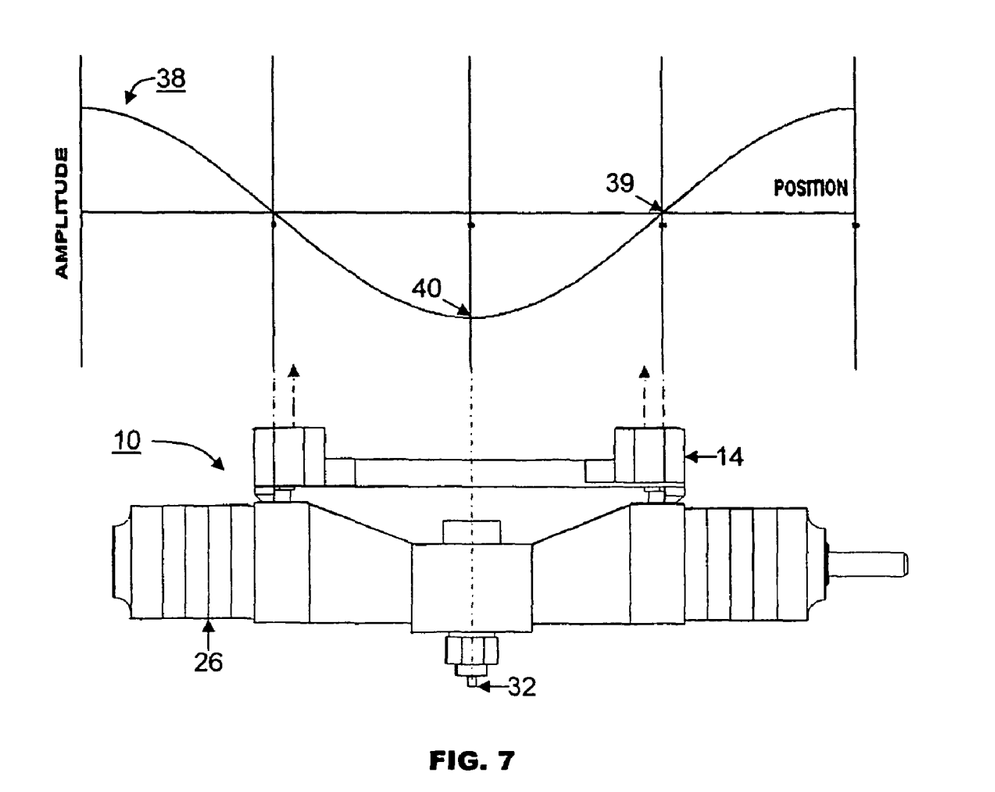
FIG. 7 is a graph showing the varying amplitudes of vibration along the transducer of FIG. 6 when ultrasonic vibrational energy is generated.

FIG. 7 is a graph showing the varying amplitudes of vibration 38 along the transducer 10 when ultrasonic vibrational energy is generated. The ultrasonic vibrational energy generated by the ultrasonic generators 26 will excite the transducer 10 such that the amplitudes of vibration 38 along various points on the longitudinal axis of the transducer 10 exhibit characteristics of a standing waveform. The threaded mounting holes 24 of the horn 20 and the corresponding throughholes of the holder 12 are preferably located on vibrational nodes on the transducer 10 where amplitudes of vibration are lowest. This is to prevent the loss of ultrasonic vibrational energy through transmission via the mounting interface, and hence to the bonding apparatus.

Conversely, the tip of the collet 32 should be disposed at a vibrational anti-nodal position 40, so that a maximum amplitude of vibration is delivered to the bonding site. Thus, the tip of the collet 32 is preferably attached at the midsection 25 of the horn 20.

Figure 8:
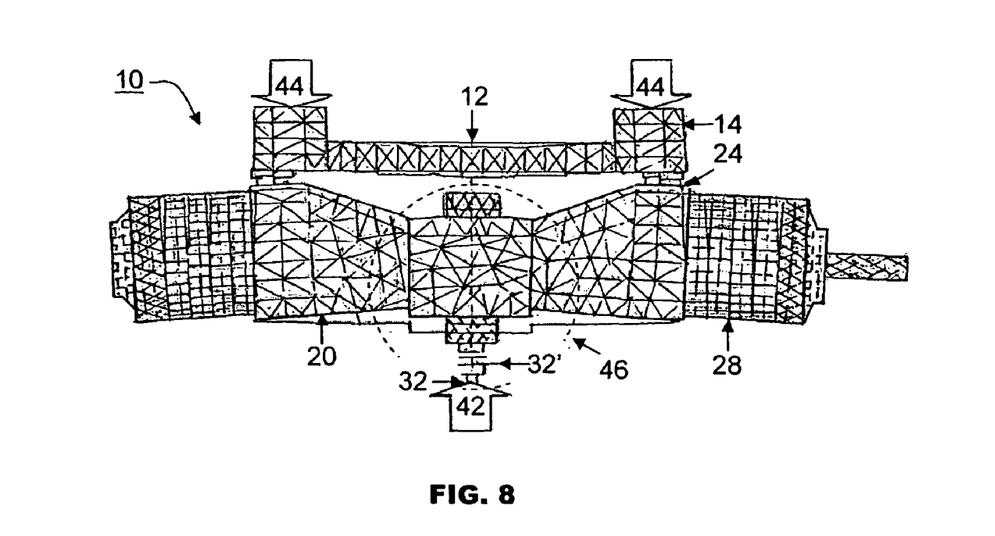
FIG. 8 is a Finite Element Analysis (FEA) mesh diagram showing the effect of an upward reaction force exerted on the collet of the transducer according to the preferred embodiment of the invention.

FIG. 8 is a Finite Element Analysis (FEA) mesh diagram showing the effect of a force 42 exerted on the collet 32 of the transducer 10 according to the preferred embodiment of the invention. During the bonding process, high pressure and power are required to drive the transducer 10 for simultaneously bonding a number of conductive bumps onto the bond pads. The collet 32 of the transducer 10 will therefore experience an upward reaction force exerted on it and a bending moment is induced in the horn 20.

This causes internal stresses within the lattice structure of the horn 20, and deformation may occur. When the upward force 42 is exerted on the tip of the collet 32, the tip will be retracted and shifted to a new position at 32'. Corresponding deformation of the horn 20 is observable at the circled region 46 highlighted in FIG. 8. The upward reaction force 42 exerted on the collet 32 will introduce reaction forces 44 at the flange mounts 14, but the holder 12 is structurally rigid and will not tend to bend together with the horn body 20.

The transducer assembly 10 is configured such that the holder 12 is substantially rigid and does not tend to bend with the horn when a compressive force is applied to the horn 20 at the collet 32. Deformation is thus substantially confined to the midsection 25 of the horn where a maximum amplitude of oscillation is required. Deformation stresses at the mounting portion represented by the holder 12 are drastically reduced. By thus dividing the mounting portion and the horn body into separate bodies, the deformation regions experienced by the mounting portions which were demonstrated to occur in the prior art did not occur in this transducer 10.

Figure 9:
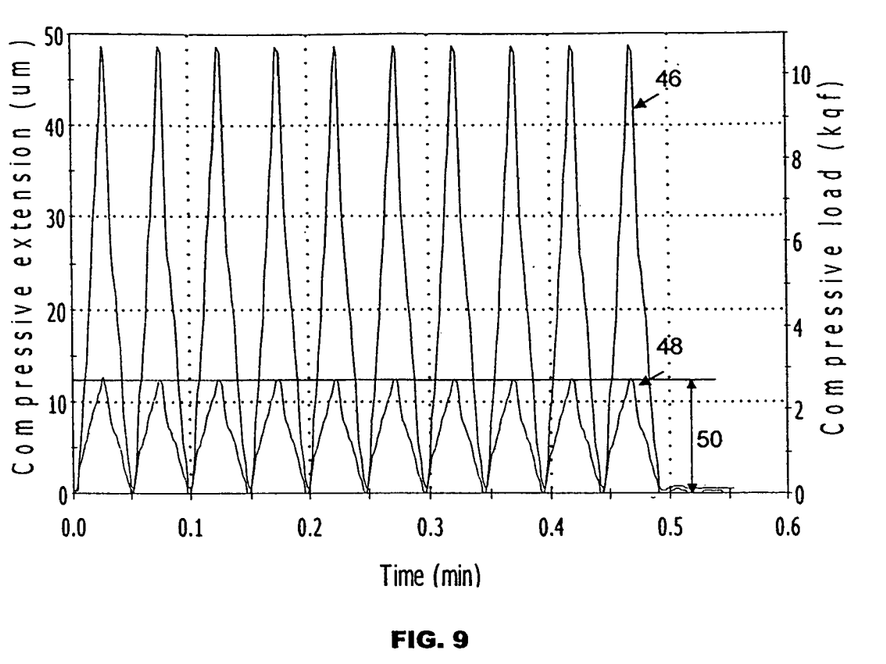
FIG. 9 is a graph showing compressive extension at the tip of the collet when the transducer according to the preferred embodiment of the invention is applied with compressive forces.

FIG. 9 is a graph showing compressive extension 48 at the tip of the collet 32 when the transducer 10 is applied with compressive forces 46. The data recorded shows that when a compressive force 46 of 10 kgf is applied to the collet 32 at 0.05 minutes (3 seconds) per cycle, the collet 32 retracts and oscillates with a maximum compressive extension 50 of approximately 13 µm.

When the compressive forces 46 are removed at the end of the bonding process, there is no permanent deformation of the horn body 20. Thus, the additional holder 12 in between the horn 20 and the bonding apparatus 18 has improved the structural integrity of the transducer 10, and hence reduced the problem of excessive deformation of the mounting portion together with the horn 20 during the bonding process.

During the bonding operation cycle, high pressure and power are repeatedly applied on the transducer 10. It can be seen from FIG. 9 that the addition of the holder 12 for mounting the horn 20 to the bonding apparatus 18 has reduced the distance that the collet 32 is compressed, so that the deformation is generally more elastic and recoverable in normal use. The temporary deformation of the horn 20 during operation, which is measurable by compressive extension at the tip of the collet 32, is maintainable within the elastic strength limit of the material so that no permanent or plastic deformation will be observable in the horn 20 when the compressive forces are removed.

It would be appreciated that the structural integrity of the transducer 10 has been enhanced by the holder 12, such that when a reaction force 42 is exerted on the collet 32, the flange mounts 14 of the holder 12 will not deform and offset from the nodal positions 39 of vibration as in the prior art. Thus, the transducer 10 is less susceptible to excitation by undesirable resonance frequencies transmitted through the bonding apparatus. Furthermore, by eliminating the deformation at the flange mounts 14 so that they do not shift from the nodal positions 39, the loss of ultrasonic vibrational energy through transmission via the mounting interfaces to the bonding apparatus is also reduced.

Moreover, due to its structural stability, the transducer 10 according to the preferred embodiment is less sensitive to changes to the mounting requirements of the bonding apparatus as compared to the prior art. Since the holder 12 is a separate component, it is easily replaceable for adapting and mounting the transducer 10 to the bonding apparatus 18 in order to cater for other flip chip packages, instead of having to also fabricate a new horn structure.

Furthermore, the material of the holder 12 may be easily changed to another material which is acoustically dissimilar with that of the horn 20. The material of the holder 12 may comprise a harder material for improving the rigidity of the holder 12, thereby enhancing the mounting stiffness of the transducer 10 to the bonding apparatus 18. Thus, the transducer 10 can be made to withstand a higher pressure and bonding force as compared to the prior art.

The invention described herein is susceptible to variations, modifications and/or addition other than those specifically described and it is to be understood that the invention includes all such variations, modifications and/or additions which fall within the spirit and scope of the above description.

The invention claimed is:

1. A bonding apparatus with a bond head, the bonding apparatus comprising:
   a bond head
   a horn including a first base end and a second base end;
   a bonding tool attached to the horn between the first base end and the second base end;
   a first ultrasonic generator secured to the first base end and a second ultrasonic generator secured to the second base end;
   a first fastening mechanism located on an outer surface of the horn between the bonding tool and the first ultrasonic generator and a second fastening mechanism located on the outer surface of the horn between the bonding tool and the second ultrasonic generator;
   a mounting interface comprising a plate to which the horn is releasably attachable using the first fastening mechanism and the second fastening mechanism, the plate further comprising point contact surfaces on a first side of the plate for contacting the outer surface of the horn; and
   the plate including mounting positions comprising flange mounts positioned on a second side of the plate and projecting from a surface of the plate and positioned at a periphery of the plate, the flange mounts configured to mount the plate to the bond head,
   wherein the first side of the plate is a surface of the plate facing the horn and the second side of the plate is a side not facing the horn and the flange mounts do not contact the horn.

2. A transducer assembly for a bonding apparatus with a bond head, the transducer assembly comprising:
   a bond head
   a horn including a first base end and a second base end;
   a bonding tool attached to the horn between the first base end and the second base end;
   a first ultrasonic generator secured to the first base end and a second ultrasonic generator secured to the second base end;
   a first fastening mechanism located on an outer surface of the horn between the bonding tool and the first ultrasonic generator;
   a second fastening mechanism located on the outer surface of the horn between the bonding tool and the second ultrasonic generator;
   a mounting interface comprising a plate to which the horn is releasably attachable using the first fastening mechanism and the second fastening mechanism, the plate further comprising point contact surfaces on a first side of the plate for contacting the outer surface of the horn; and
   the plate including transducer mounting positions comprising flange mounts positioned on a second side of the plate and projecting from a surface of the plate and positioned at a periphery of the plate, the flange mounts configured to mount the plate to the bond head,
   wherein the first side of the plate is a surface of the plate facing the horn and the second side of the plate is a side not facing the horn and the flange mounts do not contact the horn.

3. The transducer assembly as claimed in claim 2, wherein the mounting interface comprises material having a higher rigidity than the horn.

4. The transducer assembly as claimed in claim 2, wherein the horn is positioned and configured to oscillate in use as driven by the first ultrasonic generator and the second ultrasonic generator, and the first fastening mechanism and the second fastening mechanism are located at nodal positions of the horn at which amplitudes of oscillation of the horn are minimal.

5. The transducer assembly as claimed in claim 4, wherein the first fastening mechanism and the second fastening mechanism each comprise a mounting hole and the mounting interface comprises a respective through-hole corresponding to each of the mounting holes, and further comprising a screw receivable by each through-hole and each mounting hole to attach the horn to the mounting interface.

6. The transducer assembly as claimed in claim 2, wherein the mounting interface and the horn comprise acoustically dissimilar materials.

7. The transducer assembly as claimed in claim 6, wherein the mounting interface comprises wear resistant and hardened stainless steel, and the horn comprises an austenitic stainless steel.

8. The transducer assembly as claimed in claim 2, wherein the transducer assembly is configured such that the mounting interface is substantially rigid and tends to avoid bending with the horn when a compressive force is applied to the horn.

9. A transducer assembly for a bonding apparatus with a bond head, the transducer assembly comprising:
- a bond head
- a horn including a first base end and a second base end;
- a bonding tool attached to the horn between the first base end and the second base end;
- a first ultrasonic generator secured to the first base end and a second ultrasonic generator secured to the second base end;
- a first fastening mechanism located on an outer surface of the horn between the bonding tool and the first ultrasonic generator;
- a second fastening mechanism located on the outer surface of the horn between the bonding tool and the second ultrasonic generator;
- a mounting interface comprising a plate to which the horn is releasably attachable using the first fastening mechanism and the second fastening mechanism, the plate further comprising point contact surfaces positioned to contact only a top portion of the outer surface of the horn; and
- the plate including transducer mounting positions comprising flange mounts projecting from a surface of the plate and positioned at a periphery of the plate, the flange mounts do not contact the horn and are configured to mount the plate to the bond head.

10. The transducer assembly as claimed in claim 9, wherein the horn is positioned and configured to oscillate in use as driven by the first ultrasonic generator and the second ultrasonic generator, and the first fastening mechanism and the second fastening mechanism are located at nodal positions of the horn at which amplitudes of oscillation of the horn are minimal.

11. The transducer assembly as claimed in claim 10, wherein the first fastening mechanism and the second fastening mechanism each comprise a mounting hole and the mounting interface comprises a respective through-hole corresponding to each of the mounting holes, and further comprising a screw receivable by each through-hole and each mounting hole to attach the horn to the mounting interface.

12. The transducer assembly as claimed in claim 9, wherein the mounting interface and the horn comprise acoustically dissimilar materials.

13. The transducer assembly as claimed in claim 12, wherein the mounting interface comprises wear resistant and hardened stainless steel, and the horn comprises an austenitic stainless steel.

14. The transducer assembly as claimed in claim 9, wherein the transducer assembly is configured such that the mounting interface is substantially rigid and tends to avoid bending with the horn when a compressive force is applied to the horn.

\* \* \* \* \*